US012139377B2

(12) United States Patent
Abe et al.

(10) Patent No.: US 12,139,377 B2
(45) Date of Patent: Nov. 12, 2024

(54) CONTROL SYSTEM (71) Applicant: Daifuku Co., Ltd., Osaka (JP)

(72) Inventors: Takeshi Abe, Hinocho (JP); Yoshitaka Tanaka, Hinocho (JP)

(73) Assignee: Daifuku Co., Ltd., Osaka (JP)

(*) Notice: Subject to any disclaimer, the term of this patent is extended or adjusted under 35 U.S.C. 154(b) by 412 days.

(21) Appl. No.: 17/827,317

(22) Filed: May 27, 2022

(65) Prior Publication Data
US 2022/0380183 A1 Dec. 1, 2022

(30) Foreign Application Priority Data

May 28, 2021 (JP) .................................. 2021-090502

(51) Int. Cl.
*B66C 13/46* (2006.01)
*B66C 13/22* (2006.01)
*H01L 21/677* (2006.01)

(52) U.S. Cl.
CPC .............. *B66C 13/22* (2013.01); *B66C 13/46* (2013.01); *H01L 21/6773* (2013.01); *H01L 21/67733* (2013.01)

(58) Field of Classification Search
None
See application file for complete search history.

(56) References Cited

U.S. PATENT DOCUMENTS

| 8,768,545 | B2 * | 7/2014 | Ikeya | ..................... B61B 10/02 |
| | | | | 701/19 |
| 9,086,697 | B2 * | 7/2015 | Suzuki | ................ H01L 21/6773 |
| 9,758,308 | B1 * | 9/2017 | Nishikawa | ........ H01L 21/67715 |
| 10,274,943 | B2 * | 4/2019 | Takahara | .......... G05B 19/41895 |
| 2008/0080963 | A1 * | 4/2008 | Bufano | ............. H01L 21/67778 |
| | | | | 414/788 |
| 2012/0101667 | A1 * | 4/2012 | Ikeya | ................ H01L 21/67733 |
| | | | | 701/19 |

(Continued)

FOREIGN PATENT DOCUMENTS

| JP | 4123113 A | 4/1992 |
| JP | H8221124 A | 8/1996 |

(Continued)

*Primary Examiner* — Peter D Nolan
*Assistant Examiner* — Jacob Kent Besteman-Street
(74) *Attorney, Agent, or Firm* — The Webb Law Firm (57) ABSTRACT

A control unit performs a travel stop process for stopping travel of a travel unit in response to an indicator detection unit detecting a stop notice indicator section and then detecting a stop position indicator section. After the travel of the travel unit is stopped as a result of the travel stop process, the control unit performs a transfer process for causing a transfer unit to transfer an article. The control unit performs, instead of the transfer process, anomaly notification processing for providing a notification of an occurrence of an anomaly to a superordinate control unit, after the travel of the travel unit is stopped by the travel stop process, in response to: (i) a travel distance, from a position at which the indicator detection unit has detected the stop notice indicator section, being smaller than a determination distance smaller than a notice distance, and (ii) the indicator detection unit detecting the stop position indicator section.

11 Claims, 4 Drawing Sheets

(56) References Cited

U.S. PATENT DOCUMENTS

| | | | | |
|---|---|---|---|---|
| 2013/0322990 A1* | 12/2013 | Chen | ................... | H01L 21/6773 |
| | | | | 414/217 |
| 2014/0249667 A1* | 9/2014 | Suzuki | .............. | H01L 21/67727 |
| | | | | 700/228 |
| 2017/0283182 A1* | 10/2017 | Maejima | ................. | B65G 35/08 |
| 2019/0047786 A1* | 2/2019 | Suzuki | .............. | H01L 21/67769 |
| 2020/0343111 A1* | 10/2020 | Sekiya | .............. | H01L 21/67092 |
| 2023/0058552 A1* | 2/2023 | Zheng | ................ | H01L 21/6773 |
| 2024/0190665 A1* | 6/2024 | Ueda | ................ | H01L 21/67736 |

FOREIGN PATENT DOCUMENTS

| | | | | | |
|---|---|---|---|---|---|
| JP | 201841409 A | | 3/2018 | | |
| JP | 2018041409 A | * | 3/2018 | ....... | H01L 21/67259 |

\* cited by examiner

CONTROL SYSTEM

CROSS-REFERENCE TO RELATED APPLICATION

This application claims priority to Japanese Patent Application No. 2021-090502 filed May 28, 2021, the disclosure of which is hereby incorporated by reference in its entirety.

BACKGROUND OF THE INVENTION

1. Field of the Invention

The present invention relates to a control system for controlling an article transport vehicle that travels along a predetermined travel route and transports an article.

2. Description of the Related Art

An example of such a control system is disclosed in JP 4-123113A (Patent Document 1). Hereinafter, in "Description of the Related Art", the reference numerals in Patent Document 1 are cited in parentheses.

Patent Document 1 discloses a control system for controlling a mobile vehicle (A) that travels along a travel route and transports a load. The travel route of the mobile vehicle (A) passes through a plurality of stations (ST) for the mobile vehicle (A) to perform operations such as loading and/or unloading a load, and the mobile vehicle (A) is controlled to stop at an area (hereinafter, referred to as "stop site") in which a target station (ST) is located. In the control system of Patent Document 1, the mobile vehicle (A) is controlled to stop at a stop site using marks (M) provided at positions that correspond to the stop site. Specifically, the marks (M) include a mark (M2) that indicates a stop position of the mobile vehicle (A), and a mark (M1) provided rearward relative to this mark (M2) in the traveling direction, and the mobile vehicle (A) includes a mark sensor (6) that detects the two marks (M1, M2). After the mark (M1) is detected by the mark sensor (6), a control apparatus (9) provided in the mobile vehicle (A) starts deceleration control of the mobile vehicle (A) when the distance from the mobile vehicle (A) to the stop position is equal to a set distance. Upon detection of the mark (M2) by the mark sensor (6), the control apparatus (9) stops the mobile vehicle (A).

As described above, in the control system of Patent Document 1, when the mark provided rearward in the traveling direction relative to the mark indicating a stop position is detected by the mark sensor, and then the mark indicating a stop position is detected by the mark sensor, the travel of the mobile vehicle is stopped. That is to say, when a stop notice indicator section is detected by an indicator detection unit and then a stop position indicator section is detected by the indicator detection unit, travel stop processing for stopping an article transport vehicle is executed. Then, after the travel of the article transport vehicle is stopped by the travel stop processing, an article is transferred to or from a transfer target location (in Patent Document 1, a load is loaded or unloaded at a station).

Meanwhile, there is a possibility that, although the article transport vehicle does not reach any stop position, the stop position indicator section is erroneously detected by the indicator detection unit due to some reason, such as when something that is not the stop position indicator section is detected as the stop position indicator section. Examples of the reasons for the above-described erroneous determination may be a malfunction of the indicator detection unit, aged deterioration of the stop position indicator, and noise such as ambient light. If such erroneous determination occurs, the travel of the article transport vehicle is stopped based on the erroneous determination, and then an article is tried to be transferred, it is difficult to appropriately transfer the article because the article transport vehicle has not reached the stop position.

SUMMARY OF THE INVENTION

Therefore, in view of the above, there is a demand for realizing a technology that can reduce, even if a stop position indicator section is erroneously detected by an indicator detection unit, a risk that an article is transferred under a situation that it is difficult to appropriately transfer the article.

As one aspect, a control system according to the present disclosure is a control system for controlling an article transport vehicle configured to travel along a predetermined travel route and transport an article, the control system including: a stop position indicator at a position corresponding to a stop site provided for the article transport vehicle on the travel route; and a superordinate control unit communicably connected to the article transport vehicle and configured to output an operation command for the article transport vehicle; wherein the article transport vehicle includes: a travel unit configured to travel along the travel route; a transfer unit configured to hold the article and transfer the article to and from a transfer target location at the stop site; an indicator detection unit configured to detect the stop position indicator; and a control unit configured to control the travel unit and the transfer unit, the stop position indicator includes: a stop position indicator section indicating a stop position for the article transport vehicle; and a stop notice indicator section on an upstream side of the stop position indicator section, the upstream side being a rearward side in a travel direction of the article transport vehicle traveling along the travel route, the stop notice indicator section has on the upstream side an end apart from the stop position indicator section to the upstream side by a predetermined notice distance, in response to the indicator detection unit detecting the stop notice indicator section and then detecting the stop position indicator section, the control unit performs a travel stop process for stopping travel of the travel unit, and performs, after the travel of the travel unit is stopped as a result of the travel stop process, a transfer process for causing the transfer unit to transfer the article, the article transport vehicle further includes a travel distance detection unit configured to detect a travel distance of the travel unit, and the control unit performs, instead of the transfer process, an anomaly notification process for providing a notification of an occurrence of an anomaly to the superordinate control unit, after the travel of the travel unit is stopped by the travel stop process, in response to (i) the travel distance from a position at which the indicator detection unit has detected the stop notice indicator section being not larger than a determination distance smaller than the notice distance and (ii) the indicator detection unit detecting the stop position indicator section.

If the distance (hereinafter, referred to as "object distance") between the position at which the stop notice indicator section is detected by the indicator detection unit, and the position at which the stop position indicator section is detected by the indicator detection unit is apparently shorter than the notice distance, which is a distance between the end of the stop notice indicator section on the upstream side and the stop position indicator section, there is a high likelihood that the stop position indicator section has been erroneously detected by the indicator detection unit. With this configuration, if the stop notice indicator section is detected by the indicator detection unit, and then the stop position indicator section is detected by the indicator detection unit, it is possible to obtain the above-described object distance based on the travel distance of the travel unit from the position at which the stop notice indicator section is detected. Also, if the obtained object distance is shorter than the notice distance to such an extent that it is less than or equal to the determination distance, it is possible to determine that the stop position indicator section has been erroneously detected, and prevent the transfer processing from being executed after the travel of the travel unit is stopped. Accordingly, even if the stop position indicator section is erroneously detected by the indicator detection unit, it is possible to reduce a risk that an article is transferred under a situation that it is difficult to appropriately transfer the article.

Also, with this configuration, when no transfer processing is performed after the travel of the travel unit is stopped as described above, it is possible to give a notification of an occurrence of an anomaly to the superordinate control unit that outputs an operation command for the article transport vehicle. Accordingly, even if the stop position indicator section is erroneously detected by the indicator detection unit, the superordinate control unit can appropriately control the subsequent state of the article transport vehicle.

As another aspect, a control system according to the present disclosure is a control system for controlling an article transport vehicle configured to travel along a predetermined travel route and transport an article, the control system including: a stop position indicator at a position corresponding to a stop site provided for the article transport vehicle on the travel route, wherein the article transport vehicle includes: a travel unit configured to travel along the travel route; a transfer unit configured to hold the article and transfer the article to and from a transfer target location at the stop site; an indicator detection unit configured to detect the stop position indicator; and a control unit configured to control the travel unit and the transfer unit, the stop position indicator includes: a stop position indicator section indicating a stop position for the article transport vehicle; and a stop notice indicator section arranged on an upstream side with respect to the stop position indicator section, the upstream side being a rearward side in a travel direction of the article transport vehicle traveling along the travel route, the stop notice indicator section has on the upstream side an end apart from the stop position indicator section to the upstream side by a predetermined notice distance, in response to (i) the indicator detection unit detecting the stop notice indicator section and (ii) the control unit then determining based on a result of the indicator detection unit detecting the stop position indicator section that the article transport vehicle has reached a position at which the stop position indicator section is disposed, the control unit performs a travel stop process for stopping travel of the travel unit, and performs, after the travel of the travel unit is stopped as a result of the travel stop process, a transfer process for causing the transfer unit to transfer the article, the article transport vehicle further includes a travel distance detection unit configured to detect a travel distance of the travel unit, and in response to (i) the travel distance from a position at which the indicator detection unit has detected the stop notice indicator section being not larger than a determination distance smaller than the notice distance and (ii) the indicator detection unit detecting the stop position indicator section, the control unit does not determine that the article transport vehicle has reached the position at which the stop position indicator section is disposed and continues travel of the travel unit, and in response to the travel distance from a position at which the indicator detection unit has detected the stop notice indicator section exceeding the determination distance, and the indicator detection unit then detecting the stop position indicator section, the control unit determines that the article transport vehicle has reached the position at which the stop position indicator section is disposed.

If the distance (hereinafter, referred to as "object distance") between a position at which the stop notice indicator section is detected by the indicator detection unit, and a position at which the stop position indicator section is detected by the indicator detection unit is apparently shorter than the notice distance, which is a distance between the end of the stop notice indicator section on the upstream side and the stop position indicator section, there is a high likelihood that the stop position indicator section has been erroneously detected by the indicator detection unit. With this configuration, if the stop notice indicator section is detected by the indicator detection unit, and then the stop position indicator section is detected by the indicator detection unit, it is possible to obtain the above-described object distance based on the travel distance of the travel unit from the position at which the stop notice indicator section is detected. Also, if the obtained object distance is shorter than the notice distance to such an extent that it is less than or equal to the determination distance, it is possible to determine that the stop position indicator section has been erroneously detected (in other words, it is possible to not determine that the article transport vehicle has reached the position at which the stop position indicator section is provided), and continue the travel of the travel unit without stopping the travel of the travel unit. Therefore, even if the stop position indicator section is erroneously detected by the indicator detection unit, it is possible to reduce a risk that an article is transferred under a situation that it is difficult to appropriately transfer the article.

Further features and advantages of the control system will become apparent from the following description of embodiments given with reference to the drawings.

DETAILED DESCRIPTION OF PREFERRED EMBODIMENTS

Figure 1:
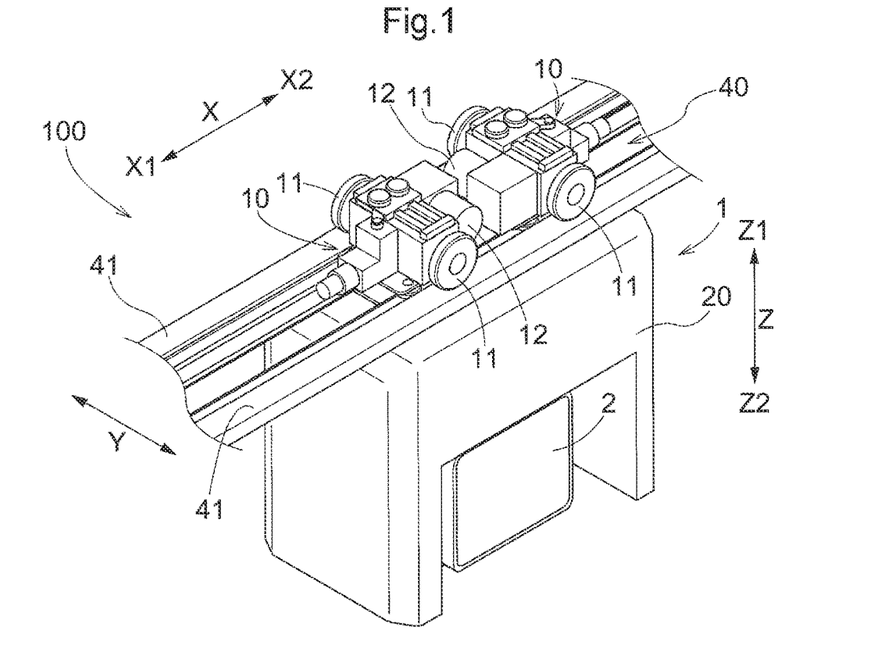
FIG. 1 is a perspective view illustrating an article transport vehicle.
Figure 2:
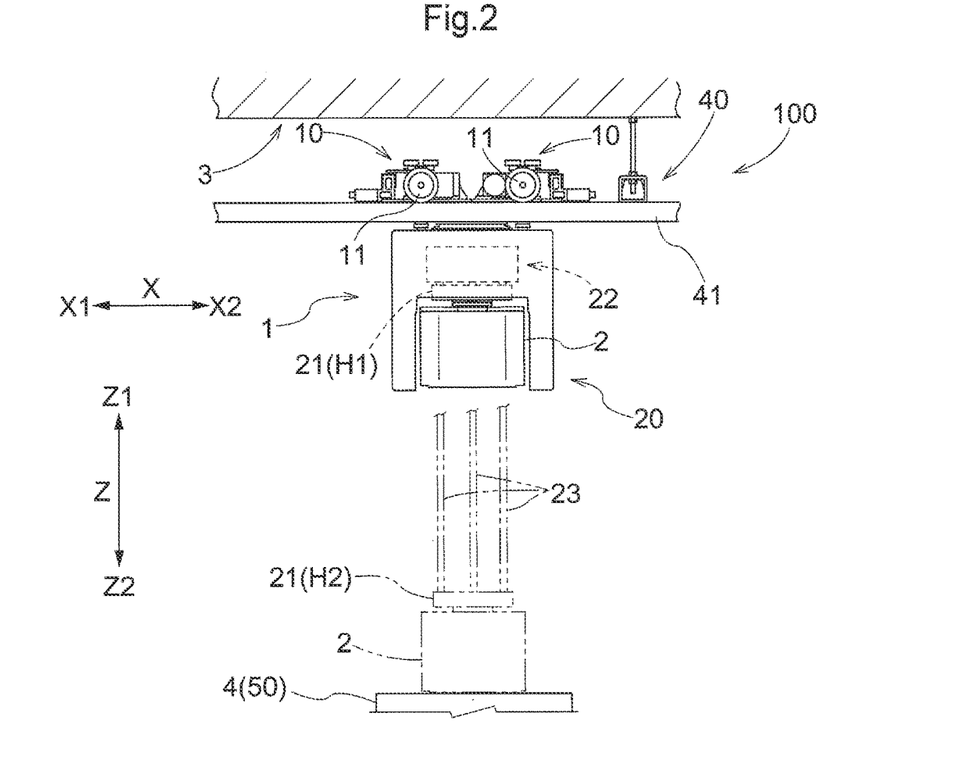
FIG. 2 is a side view illustrating the article transport vehicle.
Figure 3:
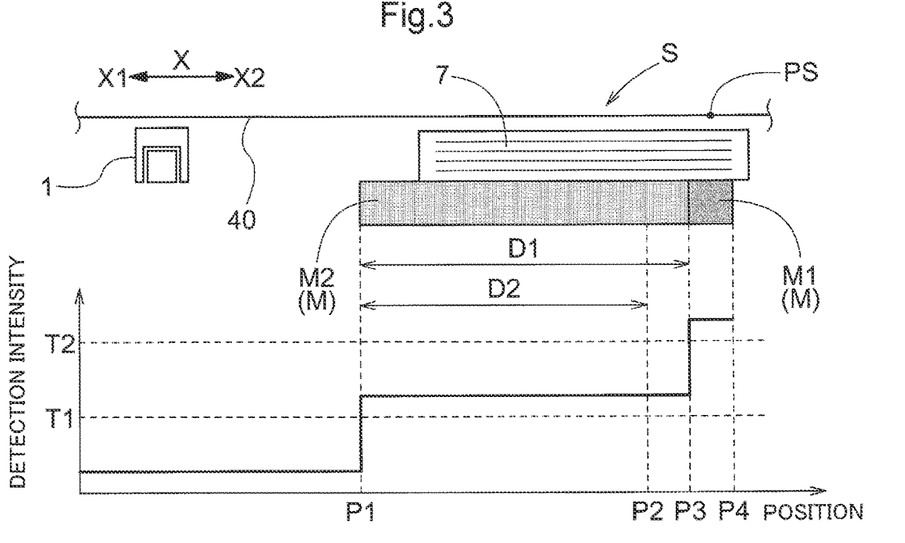
FIG. 3 is a diagram illustrating a control system.

Embodiments of a control system will be described with reference to the drawings. A control system 200 is a system for controlling an article transport vehicle 1 (see FIGS. 1 and 2) that travels along a predetermined travel route 40 and transports an article 2. The article transport vehicle 1 transports the article 2 in an article transport facility 100. The article 2 is a FOUP (Front Opening Unified Pod) in which semiconductor wafers are stored, for example. In the present embodiment, the article transport vehicle 1 travels along the travel route 40 in one direction. Here, as shown in FIGS. 1 to 3, the forward side in a travel direction X of the article transport vehicle 1 that travels along the travel route 40 is referred to as "downstream side X2", and the rearward side in the travel direction X is referred to as "upstream side X1". The travel direction X matches the longitudinal direction of the travel route 40 (in which the travel route 40 extends). Also, a direction that is orthogonal to both the travel direction X and an up-down direction Z (vertical direction) is referred to as "width direction Y".

The travel route 40 may be physically formed or virtually set. In the present embodiment, the travel route 40 is physically formed using at least one travel rail 41. Specifically, the article transport facility 100 includes the travel rails 41 (here, a pair of travel rails 41 arranged at a distance in the width direction Y) arranged along the travel route 40, and the article transport vehicle 1 travels along the travel rails 41. As shown in FIG. 2, the travel rails 41 are supported while being suspended from a ceiling 3, and the travel route 40 is formed along the ceiling 3. That is to say, in the present embodiment, the article transport vehicle 1 is a ceiling transport vehicle that travels along the travel route 40 formed on the ceiling 3. Note that the article transport vehicle 1 may be an article transport vehicle other than the ceiling transport vehicle. Examples of the article transport vehicle other than the ceiling transport vehicle include an article transport vehicle that travels along a travel route formed on a floor. In this case, the travel route may be formed by travel rails, or may be virtually set.

As shown in FIGS. 1 and 2, the article transport vehicle 1 includes at least one travel unit 10 that travels along the travel route 40. The travel unit 10 includes wheels 11, and a travel drive unit 12 (for example, an electric motor such as a servomotor) that rotates the wheels 11. As a result of the wheels 11 being driven to rotate by the travel drive unit 12, the travel unit 10 travels along the travel route 40. In the present embodiment, the wheels 11 are provided to roll on the travel surfaces (here, the upper surfaces) of the travel rails 41, and the travel unit 10 travels along the travel rails 41 (here, the pair of travel rails 41). In the present embodiment, the article transport vehicle 1 includes a pair of travel units 10 aligned in the travel direction X.

Figure 5:
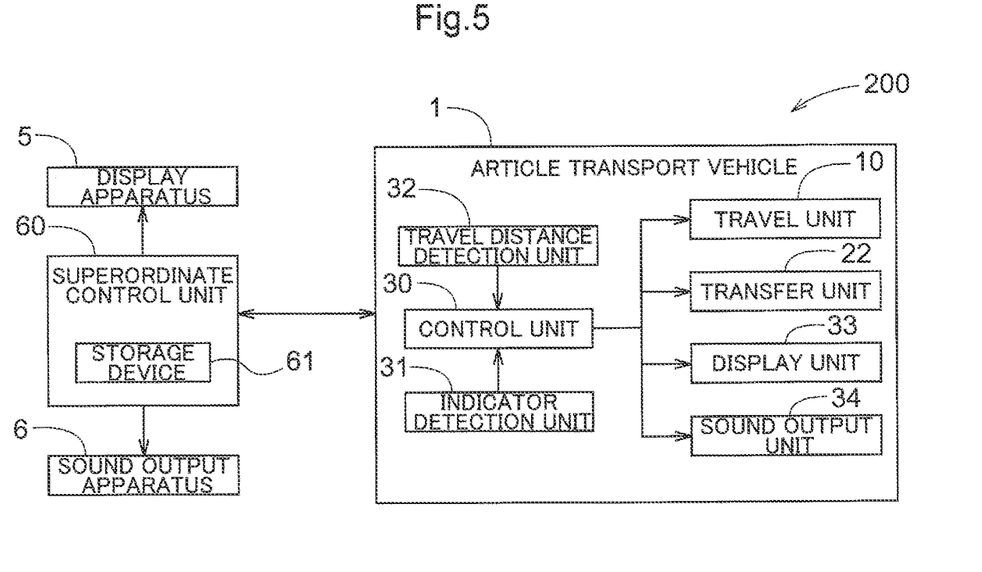
FIG. 5 is a control block diagram.

As shown in FIG. 5, the article transport vehicle 1 includes a travel distance detection unit 32 that detects a travel distance ΔX of the travel units 10. In the present embodiment, the travel distance detection unit 32 detects the travel distance ΔX based on an amount of rotation (number of rotations) of the wheels 11. Specifically, the travel distance detection unit 32 derives an amount of wheel movement based on the amount of rotation of the wheels 11 and the diameter of the wheels 11, and detects the derived amount of wheel movement as the travel distance ΔX. The travel distance detection unit 32 obtains the amount of rotation of the wheels 11, based on a result detected by an encoder provided on an output shaft of the travel drive unit 12.

As shown in FIG. 2, the article transport vehicle 1 includes a transfer unit 22 that holds an article 2 and transfers the article 2 to and from a transfer target location 4. The transfer target location 4 is provided on a station 50 that is set on the travel route 40 and serves as a destination of the travel of the article transport vehicle 1. That is to say, the transfer target location 4 is provided at a stop site S (see FIG. 3) for the article transport vehicle 1 that is provided on the travel route 40. Examples of the transfer target location 4 include a load port of a processing apparatus for processing the article 2, a storage rack for storing the article 2, and a portion (such as a pedestal or a conveyor) at which the article 2 is to be loaded and unloaded and that is provided on the storage rack for storing the article 2.

As shown in FIG. 2, a transfer unit 22 includes a holding unit 21 that holds the article 2, and transfers the article 2 between the holding unit 21 and the transfer target location 4. In the present embodiment, the transfer unit 22 is configured to move the holding unit 21 between a reference position H1 and a transfer position H2. The reference position H1 is a position of the holding unit 21 while the travel units 10 travel. In the present embodiment, the article transport vehicle 1 includes a main body portion 20 coupled to the travel units 10, and the reference position H1 is a position that overlaps the main body portion 20 when viewed vertically in the up-down direction Z (in a plan view). Specifically, the reference position H1 is a position at which the article 2 held by the holding unit 21 is housed in the main body portion 20. In this example, the main body portion 20 is supported by the travel units 10 while being arranged on a lower side Z2 relative to the travel units 10, and the internal space (in which the article 2 is housed) of the main body portion 20 is formed so as to be open to at least the lower side Z2.

The transfer position H2 is a position of the holding unit 21 while the article 2 is transferred between the transfer unit 22 and the transfer target location 4. The transfer position H2 is set so as to correspond to the position of each transfer destination 4. As shown in FIG. 2, in the present embodiment, the transfer position H2 is a position that is located on an upper side Z1 relative to the transfer target location 4, and overlaps the transfer target location 4 when viewed in a plan view. In the present embodiment, the transfer position H2 is a position located on the lower side Z2 relative to the reference position H1. Also, in the present embodiment, the transfer position H2 is a position that overlaps the main body portion 20 when viewed in a plan view. That is to say, the transfer position H2 is arranged at the same position in the width direction Y as the reference position H1.

In the present embodiment, the transfer unit 22 moves the holding unit 21 between the reference position H1 and the transfer position H2 by lifting and lowering the holding unit 21 with respect to the travel units 10 (moving the holding unit 21 in the up-down direction Z). As shown in FIG. 2, in the present embodiment, the transfer unit 22 lifts and lowers the holding unit 21 while the holding unit 21 is suspended and supported. Specifically, the holding unit 21 is coupled to leading ends of transmission members 23 such as belts or wires, and the transfer unit 22 rotates, using a driving force of a drive unit such as an electric motor, a winding body (not shown) around which the transmission members 23 are wound so as to wind up or unwind the transmission members 23, thereby lifting and lowering the holding unit 21.

Thus, in the present embodiment, the transfer position H2 is arranged at the same position in the width direction Y as the reference position H1, and the transfer unit 22 is configured to move the holding unit 21 in the up-down direction Z with respect to the travel units 10, so as to move the holding unit 21 between the reference position H1 and the transfer position H2. In contrast to this configuration, a configuration is also possible in which the transfer position H2 is arranged at a different position in the width direction Y from the reference position H1, and the transfer unit 22 is configured to move the holding unit 21 in the width direction Y with respect to the travel units 10, or move the holding unit 21 in the up-down direction Z and the width direction Y with respect to the travel units 10, so as to move the holding unit 21 between the reference position H1 and the transfer position H2.

When transferring the article 2 to the transfer target location 4, the transfer unit 22 moves the holding unit 21 from the reference position H1 to the transfer position H2 that corresponds to the transfer target location 4. In the present embodiment, the holding unit 21 holds the article 2 from the upper side Z1. Then, the holding unit 21 is configured to be able to change the orientation (at least one of position and direction) of the holding unit 21 (specifically, a holding member of the holding unit 21) between a holding orientation for holding the article 2 and a release orientation for releasing the article 2.

When the article 2 is transferred from the holding unit 21 to the transfer target location 4, the transfer unit 22 moves the holding unit 21 that holds the article 2 from the reference position H1 to the transfer position H2, then changes the orientation of the holding unit 21 from the holding orientation to the release orientation, and then moves the holding unit 21 from the transfer position H2 to the reference position H1. With this, the article 2 held by the holding unit 21 is placed at the transfer target location 4. Also, when the article 2 is transferred from the transfer target location 4 to the holding unit 21, the transfer unit 22 moves the holding unit 21 that does not hold any article 2 from the reference position H1 to the transfer position H2, then changes the orientation of the holding unit 21 from the release orientation to the holding orientation, and then moves the holding unit 21 from the transfer position H2 to the reference position H1. With this, an article 2 placed at the transfer target location 4 is held by the holding unit 21 and is taken out from the transfer target location 4.

In contrast to this configuration, a configuration is also possible in which an article 2 is transferred between the holding unit 21 and the transfer target location 4 by, for example, a holding unit 21 holding an article 2 from the lower side Z2, and the transfer unit 22 lifting and lowering the holding unit 21 at the transfer position H2. Specifically, a configuration is possible in which the transfer unit 22 moves the holding unit 21 upward at the transfer position H2 to lift the article 2 supported on the transfer target location 4 using the holding unit 21, so that the article 2 is transferred from the transfer target location 4 to the holding unit 21, and lowers the holding unit 21 at the transfer position H2, so that the article 2 held by the holding unit 21 is unloaded onto the transfer target location 4.

As shown in FIG. 5, the article transport vehicle 1 includes a control unit 30 that controls the travel units 10 and the transfer unit 22. The control unit 30 is configured to be able to acquire information indicating a result of detecting a travel distance ΔX by the above-described travel distance detection unit 32, and information indicating a result of detecting a stop position indicator M by a later-described indicator detection unit 31. The control system 200 includes a superordinate control unit 60 communicably connected to the article transport vehicle 1, and the superordinate control unit 60 outputs operation commands for the article transport vehicle 1. In the present embodiment, the article transport facility 100 includes a plurality of article transport vehicles 1, and the superordinate control unit 60 is communicably connected to the plurality of article transport vehicles 1, and outputs operation commands for the plurality of article transport vehicles 1. The control unit 30 controls the travel units 10 and the transfer unit 22 (specifically, the travel units 10 and the transfer unit 22 of the article transport vehicle 1 that includes this control unit 30) in response to the operation command given from the superordinate control unit 60. Functions of the control unit 30 and functions of the superordinate control unit 60 are realized by cooperation between hardware such as an arithmetic processing unit and a program executed on this hardware, for example.

The operations commands for the article transport vehicle 1 given from the superordinate control unit 60 include a travel command that contains information designating a travel destination. In response to the travel command given from the superordinate control unit 60, the control unit 30 controls the travel units 10 (specifically, the travel drive unit 12) so that they travel to a destination designated by the travel command. If the destination is the station 50 at which the transfer target location 4 is set, the control unit 30 controls the transfer unit 22 to transfer an article 2 to or from the transfer target location 4, after the travel of the travel units 10 is stopped at the destination.

As shown in FIG. 3, the control system 200 includes the stop position indicator M provided at a position that corresponds to the stop site S for the article transport vehicle 1, the stop site S being provided on the travel route 40. The stop position indicator M is attached to the travel rails 41 (specifically, lower surfaces of the travel rails 41), for example. When the stop site S in which the stop position indicator M is provided is set as a destination for the travel of the article transport vehicle 1, the stop position indicator M is used for the article transport vehicle 1 to stop at the stop site S. In the present embodiment, the control system 200 further includes an information holder 7 that is disposed at a position that corresponds to the stop site S. The information holder 7 holds information relating to the stop site S such as address information that indicates the position of the stop site S.

The stop position indicator M includes a stop position indicator section M1 that indicates a stop position PS of the article transport vehicle 1. The stop position PS is a design stop position of the article transport vehicle 1 that is provided at the stop site S in which the stop position PS is set. The stop position PS is set according to the position of the transfer target location 4 arranged at the stop site S. Specifically, the stop position PS is set at a position for the transfer unit 22 to be arranged to an appropriate position for transferring the article 2 to or from the transfer target location 4. As will be described later, upon detection of the stop position indicator section M1 by the indicator detection unit 31, the control unit 30 executes travel stop processing for stopping the travel of the travel units 10. If the position at which the stop position indicator section M1 has been detected by the indicator detection unit 31 is a planned position (in FIG. 3, a third position P3), the article transport vehicle 1 is stopped at the stop position PS by the execution of the travel stop processing.

The stop position indicator M further includes a stop notice indicator section M2 disposed on the upstream side X1 with respect to the stop position indicator section M1. As shown in FIG. 3, an end of the stop notice indicator section M2 on the upstream side X1 is arranged at a position apart from the stop position indicator section M1 (specifically, an end of the stop position indicator section M1 on the upstream side X1) to the upstream side X1 by a predetermined notice distance D1. In the example shown in FIG. 3, an end of the stop notice indicator section M2 on the downstream side X2 is arranged at the same position in the travel direction X as the end of the stop position indicator section M1 on the upstream side X1. Here, the stop notice indicator section M2 is formed in a belt shape extending in the travel direction X. Note that, in contrast to the example shown in FIG. 3, a configuration is also possible in which the end of the stop notice indicator section M2 on the downstream side X2 is distanced to the upstream side X1 from the end of the stop position indicator section M1 on the upstream side X1.

As shown in FIG. 5, the article transport vehicle 1 includes the indicator detection unit 31 that detects the stop position indicator M. The indicator detection unit 31 detects both the stop position indicator section M1 and the stop notice indicator section M2. In the present embodiment, the indicator detection unit 31 uses a common sensor (such as an optical sensor or a magnetic sensor) to detect both the stop position indicator section M1 and the stop notice indicator section M2. In contrast to this configuration, a configuration is also possible in which the indicator detection unit 31 includes a sensor for detecting the stop position indicator section M1 as well as a sensor for detecting the stop notice indicator section M2. Although details are omitted, the article transport vehicle 1 includes a reader device (not shown) for reading information held in the information holder 7 (see FIG. 3). If the information holder 7 is a bar code, the reader device is a bar code reader.

In the present embodiment, the stop position indicator M is constituted by a light reflection member such as a light reflection tape, and the indicator detection unit 31 includes an optical sensor that detects the stop position indicator M (specifically, an optical sensor that detects whether or not there is the stop position indicator M). The optical sensor is a reflection-type optical sensor, and detects the stop position indicator M by projecting detection light and receiving reflected light (reflected light from a detection target) of the detection light. The stop position indicator M is configured to have a higher reflectance of detection light than that of a member (for example, the travel rails 41) to which the stop position indicator M is attached. Therefore, the stop position indicator M is detected when the intensity of reflected light detected by the indicator detection unit 31 is changed from a value lower than a predetermined threshold to a value greater than or equal to the threshold.

The stop position indicator section M1 and the stop notice indicator section M2 are configured to have different reflectances of detection light, and the indicator detection unit 31 detects the stop position indicator section M1 and the stop notice indicator section M2 separately, based on the magnitude of the detected intensity of reflected light. In the present embodiment, the stop position indicator section M1 is configured to have a higher reflectance of detection light than that of the stop notice indicator section M2. Therefore, the stop notice indicator section M2 is detected when the intensity of reflected light detected by the indicator detection unit 31 is changed from a value lower than a predetermined first threshold T1 to a value greater than or equal to the first threshold T1. Also, the stop position indicator section M1 is detected when the intensity of reflected light detected by the indicator detection unit 31 is changed from a value lower than a predetermined second threshold T2 to a value greater than or equal to the second threshold T2. The second threshold T2 is set to a value greater than the first threshold T1.

FIG. 3 shows a change (ideal change) in the intensity of reflected light detected by the indicator detection unit 31 with respect to positions of the article transport vehicle 1 when there is no error in the detection performed by the indicator detection unit 31. As shown in FIG. 3, when the article transport vehicle 1 travels to the downstream side X2, the intensity of reflected light detected by the indicator detection unit 31 increases in response to the article transport vehicle 1 reaching a first position P1 (position at which the end of the stop notice indicator section M2 on the upstream side X1 is arranged), and thus the stop notice indicator section M2 is detected. Then, the intensity of reflected light detected by the indicator detection unit 31 is maintained at the increased intensity until the article transport vehicle 1 reaches the third position P3 (position at which the end of the stop position indicator section M1 on the upstream side X1 is arranged) located on the downstream side X2 relative to the first position P1. The above-described first threshold T1 is set to a value lower than that of the intensity of reflected light detected by the indicator detection unit 31 when the indicator detection unit 31 receives reflected light of detection light from the stop notice indicator section M2.

The intensity of reflected light detected by the indicator detection unit 31 increases in response to the article transport vehicle 1 reaching the third position P3, and thus the stop position indicator section M1 is detected. Then, the intensity of reflected light detected by the indicator detection unit 31 is maintained at the increased intensity until the article transport vehicle 1 reaches a fourth position P4 (position at which the end of the stop position indicator section M1 on the downstream side X2 is arranged) located on the downstream side X2 relative to the third position P3. The above-described second threshold T2 is set to a value that is higher than that of the intensity of reflected light detected by the indicator detection unit 31 when the indicator detection unit 31 receives reflected light of detection light from the stop notice indicator section M2, and that is lower than that of the intensity of reflected light detected by the indicator detection unit 31 when the indicator detection unit 31 receives reflected light of detection light from the stop position indicator section M1.

If the stop notice indicator section M2 is detected by the indicator detection unit 31 and then the stop position indicator section M1 is detected by the indicator detection unit 31, the control unit 30 executes the travel stop processing for stopping the travel of the travel units 10, and after the travel of the travel units 10 is stopped by the travel stop processing, the control unit 30 executes transfer processing for transferring the article 2 to the transfer unit 22. Note here that the stop position indicator section M1 and the stop notice indicator section M2 are a stop position indicator section M1 and a stop notice indicator section M2 that are included in the stop position indicator M disposed at a stop site S serving as a destination.

In the present embodiment, when the stop notice indicator section M2 is detected by the indicator detection unit 31, the control unit 30 controls the travel units 10 to reduce their travel speed to a creep speed (speed for slow speed travel) until the article transport vehicle 1 reaches the third position P3. Then, when the stop position indicator section M1 is detected by the indicator detection unit 31, the control unit 30 controls the travel units 10 to reduce their travel speed to zero and stop traveling. Note that a configuration may be employed in which the deceleration of the travel speed of the travel units 10 (deceleration from the steady travel speed) starts after the stop notice indicator section M2 is detected by the indicator detection unit 31 (that is, the deceleration starts at the first position P1), or a configuration may be employed in which the deceleration of the travel speed of the travel units 10 starts before the stop notice indicator section M2 is detected by the indicator detection unit 31 (that is, the deceleration starts at a position on the upstream side X1 with respect to the first position P1).

Meanwhile, there is a possibility that, although the article transport vehicle 1 does not reach the third position P3 (position at which the end of the stop position indicator section M1 on the upstream side X1 is arranged), a stop position indicator section M1 is erroneously detected by the indicator detection unit 31 due to some reason, such as when something that is not the stop position indicator section M1 detected as the stop position indicator section M1. The stop notice indicator section M2 may be erroneously detected by the indicator detection unit 31, but such erroneous detection of the stop notice indicator section M2 by the indicator detection unit 31, such as a case where a member (for example, the travel rail 41) to which the stop position indicator M is attached is detected as the stop notice indicator section M2, can be avoided by using a polarization filter, for example. Therefore, erroneous detection of the stop position indicator section M1 by the indicator detection unit 31 is highly likely to occur compared to erroneous detection of the stop notice indicator section M2 by the indicator detection unit 31.

In view of the description above, if the stop position indicator section M1 is detected by the indicator detection unit 31 while the travel distance ΔX from the position at which the stop notice indicator section M2 has been detected by the indicator detection unit 31 is less than or equal to a determination distance D2, which is less than the notice distance D1, the control unit 30 executes, instead of the transfer processing, anomaly notification processing for giving a notification of an occurrence of an anomaly to the superordinate control unit 60, after the travel of the travel units 10 is stopped by the travel stop processing. That is to say, if the travel distance ΔX between the position at which the stop notice indicator section M2 has been detected by the indicator detection unit 31 and the position at which the stop position indicator section M1 has been detected by the indicator detection unit 31 is less than or equal to the determination distance D2, the control unit 30 executes the anomaly notification processing, instead of the transfer processing, after the travel of the travel units 10 is stopped by the travel stop processing. On the other hand, if the travel distance ΔX from the position at which the stop notice indicator section M2 has been detected by the indicator detection unit 31 exceeds the determination distance D2, and then the stop position indicator section M1 is detected by the indicator detection unit 31, the control unit 30 executes the transfer processing after the travel of the travel units 10 is stopped by the travel stop processing. That is to say, if the travel distance ΔX between the position at which the stop notice indicator section M2 has been detected by the indicator detection unit 31 and the position at which the stop position indicator section M1 has been detected by the indicator detection unit 31 is greater than the determination distance D2, the control unit 30 executes the transfer processing after the travel of the travel units 10 is stopped by the travel stop processing. As a result of the control unit 30 performing such control, it is possible to reduce, even if the stop position indicator section M1 is erroneously detected by the indicator detection unit 31, a risk that an article 2 is transferred under a situation that appropriate transfer of the article 2 is difficult.

Figure 6:
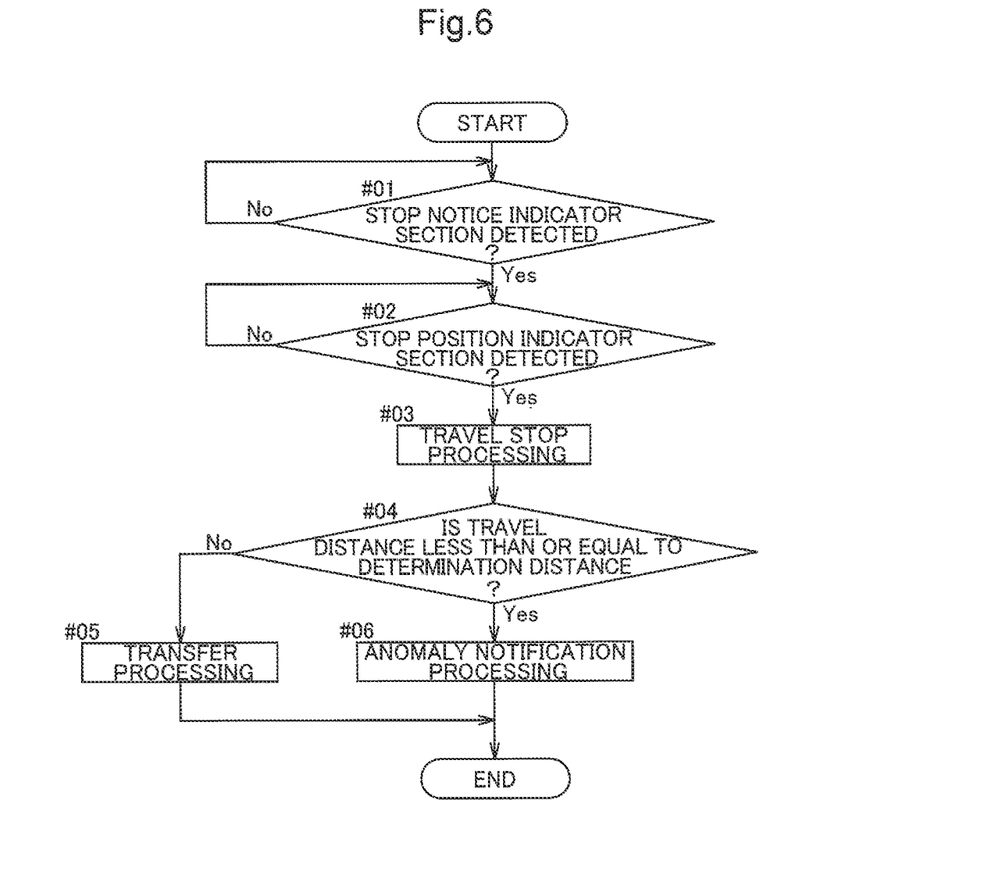
FIG. 6 is a control flow diagram.

An example of a procedure of control processing performed by the control unit 30 will be described with reference to FIG. 6. If the stop notice indicator section M2 is detected by the indicator detection unit 31 (Yes in step #01), and then the stop position indicator section M1 is detected by the indicator detection unit 31 (Yes in step #02), the control unit 30 executes the travel stop processing for stopping the travel of the travel units 10 (step #03). Then, if the travel distance ΔX between the position at which the stop notice indicator section M2 has been detected by the indicator detection unit 31 and the position at which the stop position indicator section M1 has been detected by the indicator detection unit 31 is greater than the determination distance D2 (No in step #04), the control unit 30 executes the transfer processing (step #05), and if the travel distance ΔX is less than or equal to the determination distance D2 (Yes in step #04), the control unit 30 executes the anomaly notification processing (step #06).

Figure 4:
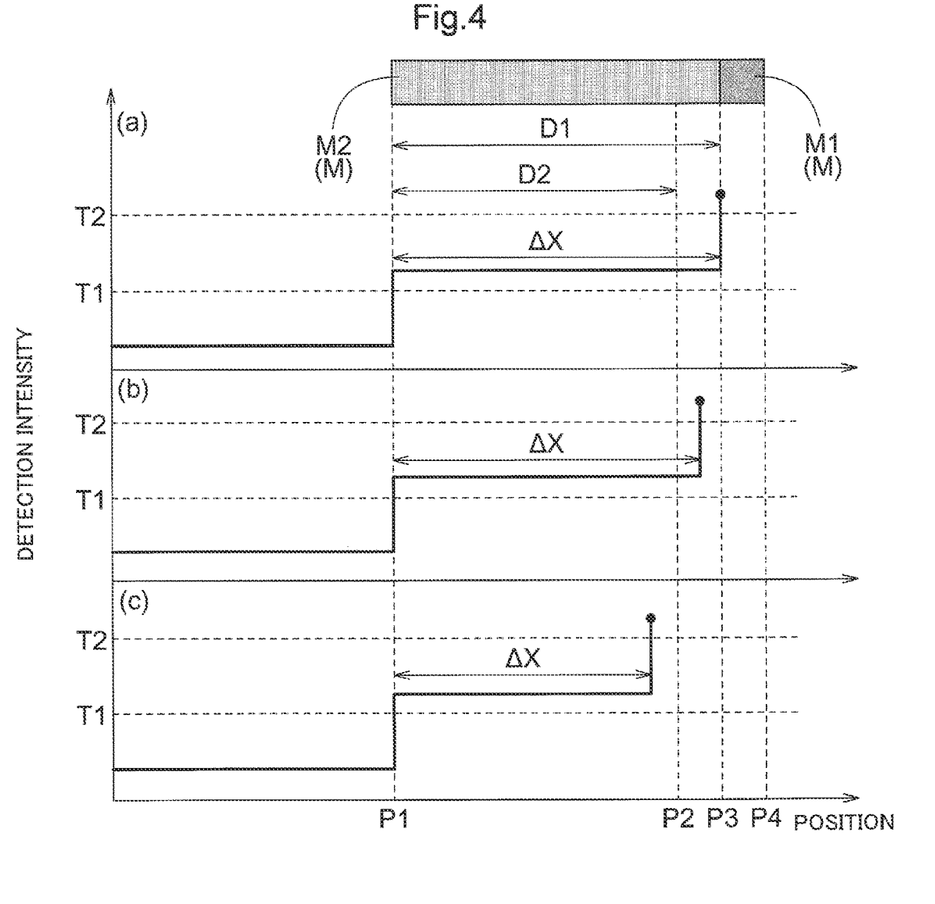
FIG. 4 is a diagram illustrating three examples of timing at which a stop position indicator section is detected by an indicator detection unit.

In the examples shown in FIGS. 3 and 4, the second position P2 is a position apart from the first position P1 (position at which the end of the stop notice indicator section M2 on the upstream side X1 is arranged) to the downstream side X2 by the determination distance D2. Then, FIGS. 4(a) and 4(b) show situations in which the travel distance ΔX (hereinafter, referred to as "object travel distance ΔX") between the position at which the stop notice indicator section M2 is detected by the indicator detection unit 31 and the position at which the stop position indicator section M1 is detected by the indicator detection unit 31 is greater than the determination distance D2. In the situations shown in FIGS. 4(a) and 4(b), the control unit 30 executes the transfer processing after the travel of the travel units 10 is stopped by the travel stop processing. In not only a case where, as shown in FIG. 4(a), the transfer processing is executed when the object travel distance ΔX is equal to the notice distance D1, but also a case where, as shown in FIG. 4(b), the transfer processing is executed when the object travel distance ΔX is between the determination distance D2 and the notice distance D1, it is possible to absorb a detection error in the travel distance ΔX by the travel distance detection unit 32 and execute the transfer processing. That is to say, the difference between the notice distance D1 and the determination distance D2 is set based on a detection error in the travel distance ΔX by the travel distance detection unit 32. In the examples shown in FIGS. 3 and 4, the determination distance D2 is set so that the difference between the notice distance D1 and the determination distance D2 is smaller than the determination distance D2.

FIG. 4(c) show a situation in which the stop position indicator section M1 is erroneously detected by the indicator detection unit 31, and the object travel distance ΔX is less than or equal to the determination distance D2. In the situation shown in FIG. 4(c), the control unit 30 executes the anomaly notification processing, instead of the transfer processing, after the travel of the travel units 10 is stopped by the travel stop processing. Preferably, a range in which the object travel distance ΔX from the position at which the stop notice indicator section M2 is detected by the indicator detection unit 31 is less than or equal to the determination distance D2 (range between the first position P1 and the second position P2 in FIGS. 3 and 4) is set in accordance with a range in which the transfer unit 22 cannot transfer an article 2 to or from the transfer target location 4.

To further reduce the risk that an article 2 is transferred under a situation that appropriate transfer of the article 2 is difficult, it is also preferable that the control unit 30 execute the transfer processing if the stop position indicator section M1 is detected by the indicator detection unit 31, and continues to be detected for a set period of time or longer. In this case, even when the object travel distance ΔX exceeds the determination distance D2, and then the stop position indicator section M1 is detected by the indicator detection unit 31, the control unit 30 executes, instead of the transfer processing, the anomaly notification processing after the travel of the travel units 10 is stopped by the travel stop processing, if the stop position indicator section M1 does not continue to be detected by the indicator detection unit 31 for the set period of time or longer.

When the control unit 30 executes the anomaly notification processing for giving a notification of an occurrence of an anomaly to the superordinate control unit 60, information relating to at least one (in the present embodiment, both) of the article transport vehicle 1 including this control unit 30 and the stop position indicator M related to the occurrence of an anomaly is transmitted from the article transport vehicle 1 to the superordinate control unit 60. Here, the stop position indicator M related to the occurrence of an anomaly is a stop position indicator M whose stop position indicator section M1 has been detected by the indicator detection unit 31 while the object travel distance $\Delta X$ is less than or equal to the determination distance D2. The information relating to the article transport vehicle 1 and/or the stop position indicator M may be information (for example, identification information of the article transport vehicle 1, and/or identification information of the stop position indicator M) for directly specifying them/it, or information (for example, as information relating to the stop position indicator M, that is, information that relates to the stop site S in which the stop position indicator M is provided) for indirectly specifying them/it.

In the present embodiment, upon receiving the notification of an occurrence of an anomaly from the control unit 30, the superordinate control unit 60 stores, in a storage device 61, anomaly occurrence information that contains information relating to at least one (in the present embodiment, both) of the article transport vehicle 1 including this control unit 30 and the stop position indicator M related to the occurrence of an anomaly. The storage device 61 includes, for example, a storage medium such as a flash memory or a hard disk. In the example shown in FIG. 5, the storage device 61 is provided on the superordinate control unit 60. Note that the superordinate control unit 60 may also be configured not to store the anomaly occurrence information in the storage device 61.

In the present embodiment, upon receiving the notification of an occurrence of an anomaly from the control unit 30, the superordinate control unit 60 re-outputs a travel command to the article transport vehicle 1 including this control unit 30, the travel command instructing the article transport vehicle 1 to travel to, as a destination, the stop site S in which the stop position indicator M is provided. In response to the travel command that was re-input, the control unit 30 restarts the travel of the travel units 10. A configuration is possible in which, when the travel of the travel units 10 is restarted, the control unit 30 starts to determine, for example, whether or not the stop position indicator section M1 has been detected by the indicator detection unit 31, at the same time when the travel of the travel units 10 is restarted. In this case, before the article transport vehicle 1 exits from the stop site S in which the stop position indicator M related to the occurrence of an anomaly is provided, the stop position indicator section M1 is detected by the indicator detection unit 31, the travel stop processing is executed in response to the detection, and the transfer processing or the anomaly notification processing is executed after the travel of the travel units 10 is stopped by the travel stop processing.

In contrast to the above-described configuration, a configuration is also possible in which the control unit 30 does not start to determine whether or not the stop position indicator section M1 has been detected by the indicator detection unit 31, at the same time when the travel of the travel units 10 is restarted. For example, a configuration is also possible in which the control unit 30 controls the travel units 10 to restart to travel, then controls the article transport vehicle 1 to exit to the downstream side X2 from the stop site S at which the stop position indicator M related to the occurrence of an anomaly is provided, and then controls the article transport vehicle 1 to travel to the same stop site S from the upstream side X1. The control unit 30 controls the article transport vehicle 1 to travel to the same stop site S from the upstream side X1, by causing the article transport vehicle 1 to make a loop around a round path included in the travel route 40, for example. In this case, when the article transport vehicle 1 reaches the same stop site S, the stop notice indicator section M2 is detected by the indicator detection unit 31, and then the stop position indicator section M1 is detected by the indicator detection unit 31. Then, when the travel stop processing is executed upon detection of the stop position indicator section M1 by the indicator detection unit 31, and the transfer processing or the anomaly notification processing is executed after the travel of the travel units 10 is stopped by the travel stop processing.

As described above, in the present embodiment, upon receiving a notification of an occurrence of an anomaly from the control unit 30, the superordinate control unit 60 re-outputs a travel command to the article transport vehicle 1 including this control unit 30, the travel command instructing the article transport vehicle 1 to travel to, as a destination, the stop site S in which the stop position indicator M is provided. Also, in the present embodiment, if the notification of an occurrence of an anomaly regarding the same stop position indicator M is given from the same article transport vehicle 1 a set number of times or more, the superordinate control unit 60 does not re-output the travel command, and performs anomaly warning using a display apparatus 5 or a sound output apparatus 6. Both the anomaly warning using a display apparatus 5 and the anomaly warning using a sound output apparatus 6 may also be performed. The set number of times is two, for example. As shown in FIG. 5, in the present embodiment, the control system 200 includes the display apparatus 5 and the sound output apparatus 6. The anomaly warning using a display apparatus 5 is executed by screen display (display of an anomaly warning screen), and the anomaly warning using a sound output apparatus 6 is executed by sound output (output of anomaly warning sound).

Figure 7:
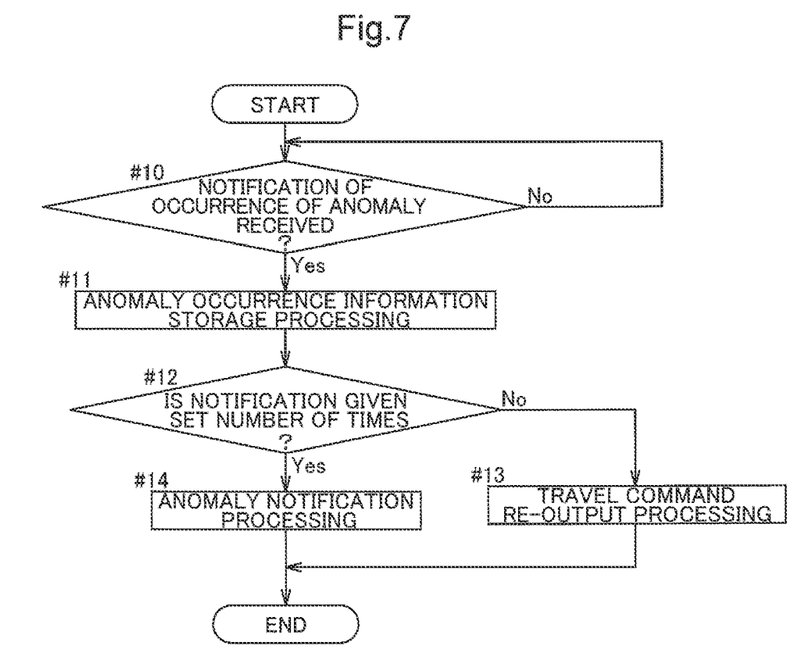
FIG. 7 is a control flow diagram.

An example of a procedure of control processing performed by the superordinate control unit 60 will be described with reference to FIG. 7. If a notification of an occurrence of an anomaly is received from the control unit 30 (Yes in step #10), the superordinate control unit 60 executes anomaly occurrence information storage processing for storing the anomaly occurrence information in the storage device 61 (step #11). Then, if the number of times the notification of an occurrence of an anomaly regarding the same stop position indicator M is given from the same article transport vehicle 1 is less than the set number of times (No in step #12), the superordinate control unit 60 executes travel command re-output processing for re-outputting a travel command to the article transport vehicle 1 including this control unit 30 to which the anomaly warning has been given, the travel command instructing the article transport vehicle 1 to travel to, as a destination, the stop site S in which the stop position indicator M related to the occurrence of an anomaly is provided (step #13). On the other hand, if the number of times the notification of an occurrence of an anomaly regarding the same stop position indicator M is given from the same article transport vehicle 1 is greater than or equal to the set number of times (Yes in step #12), the superordinate control unit 60 executes the anomaly notification processing for performing anomaly warning using the display apparatus 5 or the sound output apparatus 6 (step #14).

The technical features of the control system 200 for controlling the article transport vehicle 1 that is disclosed in the present specification are also applicable to a method for controlling the article transport vehicle 1. The method for controlling the article transport vehicle 1 is also disclosed in the present specification. In the present embodiment, the control method includes a process of the control unit 30 executing pieces of processing (steps) shown in FIG. 6, and a process of the superordinate control unit 60 executing pieces of processing (steps) shown in FIG. 7.

Other Embodiments

The following will describe other embodiments of the control system.

(1) The above-described embodiment has described an example in which, if a notification of an occurrence of an anomaly regarding the same stop position indicator M is given from the same article transport vehicle 1 a set number of times or more, the superordinate control unit 60 does not re-output the travel command, and performs anomaly warning using the display apparatus 5 or the sound output apparatus 6. However, the present disclosure is not limited to this configuration, and a configuration is also possible in which the superordinate control unit 60 performs anomaly warning if a notification of an occurrence of an anomaly is given from the same article transport vehicle 1 a set number of times or more, or a notification of an occurrence of an anomaly regarding the same stop position indicator M is given a set number of times or more, instead of if the notification of an occurrence of an anomaly regarding the same stop position indicator M is given from the same article transport vehicle 1 a set number of times or more. Also, a configuration is possible in which the superordinate control unit 60 re-outputs a travel command or performs anomaly warning, irrespective of the number of times the notification of an occurrence of an anomaly is given.

(2) The above-described embodiment has described an example in which, upon receiving a notification of an occurrence of an anomaly from the control unit 30, the superordinate control unit 60 re-outputs a travel command to the article transport vehicle 1 including this control unit 30, the travel command instructing the article transport vehicle 1 to travel to, as a destination, the stop site S in which the stop position indicator M is provided. However, the present disclosure is not limited to this configuration, and a configuration is also possible in which, instead of re-outputting a travel command to travel to, as a destination, the stop site S in which the stop position indicator M related to the occurrence of an anomaly is provided, the superordinate control unit 60 outputs a travel command to travel to, as a destination, another stop site S different from the stop site S in which the stop position indicator M related to the occurrence of an anomaly is provided.

(3) The above-described embodiment has described an example in which, upon receiving a notification of an occurrence of an anomaly from the control unit 30, the superordinate control unit 60 re-outputs a travel command to the article transport vehicle 1 including this control unit 30, the travel command instructing the article transport vehicle 1 to travel to, as a destination, the stop site S in which the stop position indicator M is provided. However, the present disclosure is not limited to this configuration, and a configuration is also possible in which, if the stop position indicator section M1 is detected by the indicator detection unit 31 while the travel distance ΔX from a position at which the stop notice indicator section M2 has been detected by the indicator detection unit 31 is less than or equal to the determination distance D2, the control unit 30 controls, by its own judgement, the travel units 10 to restart traveling after the travel of the travel units 10 is stopped by the travel stop processing. In this case, the control unit 30 may be configured not to execute the anomaly notification processing.

(4) The above-described embodiment has described an example in which, if a notification of an occurrence of an anomaly is given from the same article transport vehicle 1 regarding the same stop position indicator M a set number of times or more, the superordinate control unit 60 does not re-output the travel command, and performs anomaly warning using the display apparatus 5 or the sound output apparatus 6. However, the present disclosure is not limited to this configuration, and a configuration is also possible in which the control unit 30 performs anomaly warning using a display unit 33 or a sound output unit 34, if the number of times (hereinafter, referred to as "object number of times") the stop position indicator section M1 is detected by the indicator detection unit 31 is greater than or equal to a set number of times while the travel distance ΔX from the position at which the stop notice indicator section M2 has been detected by the indicator detection unit 31 is less than or equal to the determination distance D2. The control unit 30 may also perform both anomaly warning using the display unit 33 and anomaly warning using the sound output unit 34. Note that this set number of times may be the same as or different from the set number of times the anomaly warning is performed by the superordinate control unit 60 in the above-described embodiment. Also, the object number of times may be set as, for example, a count value for each stop position indicator M, or the sum of count values for all stop position indicators M (in other words, a count value of each article transport vehicle 1). In the example shown in FIG. 5, the display unit 33 and the sound output unit 34 are provided in the article transport vehicle 1, and the anomaly warning using the display unit 33 is executed by screen display (display of an anomaly warning screen), and the anomaly warning using the sound output unit 34 is executed by sound output (output of anomaly warning sound).

(5) The above-described embodiment has described an example in which, if the stop notice indicator section M2 is detected by the indicator detection unit 31 and then the stop position indicator section M1 is detected by the indicator detection unit 31, the control unit 30 executes the travel stop processing irrespective of whether or not an object travel distance ΔX (specifically, a travel distance ΔX between the position at which the stop notice indicator section M2 has been detected by the indicator detection unit 31 and the position at which the stop position indicator section M1 has been detected by the indicator detection unit 31) is less than or equal to the determination distance D2. However, the present disclosure is not limited to this configuration, and the following configuration is also possible.

If the stop notice indicator section M2 is detected by the indicator detection unit 31 and then it is determined that the article transport vehicle 1 has reached the position at which the stop position indicator section M1 is provided (the third position P3 in the examples shown in FIGS. 3 and 4) based on a result of detecting the stop position indicator section M1 by the indicator detection unit 31, the control unit 30 executes the travel stop processing for stopping the travel of the travel units 10, and causes the transfer unit 22 to execute the transfer processing for transferring an article 2 after the travel of the travel units 10 is stopped by the travel stop processing. Also, if the stop position indicator section M1 is detected by the indicator detection unit 31 while the travel distance ΔX from the position at which the stop notice indicator section M2 has been detected by the indicator detection unit 31 is less than or equal to the determination distance D2, the control unit 30 does not determine that the article transport vehicle 1 has reached the position at which the stop position indicator section M1 is provided, and continues the travel of the travel units 10. Accordingly, in the situation shown in FIG. 4(c), the article transport vehicle 1 is not determined to have reached the position at which the stop position indicator section M1 is provided, and the travel of the travel units 10 is continued. On the other hand, if the travel distance ΔX from the position at which the stop notice indicator section M2 has been detected by the indicator detection unit 31 exceeds the determination distance D2, and then the stop position indicator section M1 is detected by the indicator detection unit 31, the control unit 30 determines that the article transport vehicle 1 has reached the position at which the stop position indicator section M1 is provided. Accordingly, in the situation shown in FIG. 4(a) or 4(b), the article transport vehicle 1 is determined to have reached the position at which the stop position indicator section M1 is provided, and the travel stop processing and the transfer processing are executed sequentially.

Figure 8:
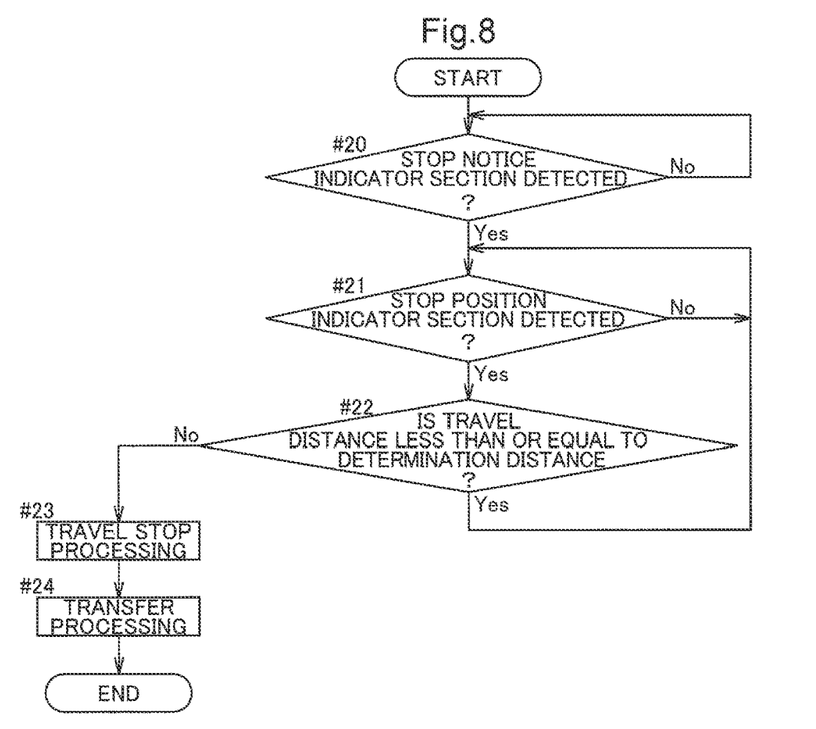
FIG. 8 is another control flow diagram according to another embodiment.

An example of a control processing performed by the control unit 30 according to the present embodiment will be described with reference to FIG. 8. If the stop notice indicator section M2 is detected by the indicator detection unit 31 (Yes in step #20), the control unit 30 determines whether or not the article transport vehicle 1 has reached a position at which the stop position indicator section M1 is provided based on a result of detecting the stop position indicator section M1 by the indicator detection unit 31. Specifically, if the stop position indicator section M1 is detected by the indicator detection unit 31 (Yes in step #21), the control unit 30 determines whether or not the object travel distance ΔX is less than or equal to the determination distance D2 (step #22). If the object travel distance ΔX is less than or equal to the determination distance D2 (Yes in step #22), the control unit 30 does not determine that the article transport vehicle 1 has reached the position at which the stop position indicator section M1 is provided and continues the travel of the travel units 10. On the other hand, if the object travel distance ΔX is greater than the determination distance D2 (No in step #22), the control unit 30 determines that the article transport vehicle 1 has reached the position at which the stop position indicator section M1 is provided, and the control unit 30 executes the travel stop processing (step #23), and executes the transfer processing (step #24) after the travel of the travel unit 10 is stopped by the travel stop processing. In the present embodiment, the method of controlling the article transport vehicle 1 includes a process in which the control unit 30 executes processing (steps) shown in FIG. 8.

(6) Note that the configurations disclosed in the above-described embodiment may be applied while being combined with configurations disclosed in other embodiments (including a combination of embodiments described as other embodiments), provided there is no inconsistency. With respect to other configurations, the embodiments disclosed in this specification are merely examples in all aspects. Accordingly, those skilled in the art may make various changes as appropriate, without departing from the spirit of this disclosure.

Overview of The Embodiments

The following will describe overview of the above-described control system.

A control system for controlling an article transport vehicle configured to travel along a predetermined travel route and transport an article includes: a stop position indicator at a position corresponding to a stop site provided for the article transport vehicle on the travel route; and a superordinate control unit communicably connected to the article transport vehicle and configured to output an operation command for the article transport vehicle; wherein the article transport vehicle includes: a travel unit configured to travel along the travel route; a transfer unit configured to hold the article and transfer the article to and from a transfer target location at the stop site; an indicator detection unit configured to detect the stop position indicator; and a control unit configured to control the travel unit and the transfer unit, the stop position indicator includes: a stop position indicator section indicating a stop position for the article transport vehicle; and a stop notice indicator section on an upstream side of the stop position indicator section, the upstream side being a rearward side in a travel direction of the article transport vehicle traveling along the travel route, the stop notice indicator section has on the upstream side an end apart from the stop position indicator section to the upstream side by a predetermined notice distance, in response to the indicator detection unit detecting the stop notice indicator section and then detecting the stop position indicator section, the control unit performs a travel stop process for stopping travel of the travel unit, and performs, after the travel of the travel unit is stopped as a result of the travel stop process, a transfer process for causing the transfer unit to transfer the article, the article transport vehicle further includes a travel distance detection unit configured to detect a travel distance of the travel unit, and the control unit performs, instead of the transfer process, an anomaly notification process for providing a notification of an occurrence of an anomaly to the superordinate control unit, after the travel of the travel unit is stopped by the travel stop process, in response to (i) the travel distance from a position at which the indicator detection unit has detected the stop notice indicator section being not larger than a determination distance smaller than the notice distance and (ii) the indicator detection unit detecting the stop position indicator section.

If the distance (hereinafter, referred to as "object distance") between the position at which the stop notice indicator section is detected by the indicator detection unit, and the position at which the stop position indicator section is detected by the indicator detection unit is apparently shorter than the notice distance, which is a distance between the end of the stop notice indicator section on the upstream side and the stop position indicator section, there is a high likelihood that the stop position indicator section has been erroneously detected by the indicator detection unit. With this configuration, if the stop notice indicator section is detected by the indicator detection unit, and then the stop position indicator section is detected by the indicator detection unit, it is possible to obtain the above-described object distance based on the travel distance of the travel unit from the position at which the stop notice indicator section is detected. Also, if the obtained object distance is shorter than the notice distance to such an extent that it is less than or equal to the determination distance, it is possible to determine that the stop position indicator section has been erroneously detected, and prevent the transfer processing from being executed after the travel of the travel unit is stopped. Accordingly, even if the stop position indicator section is erroneously detected by the indicator detection unit, it is possible to reduce a risk that an article is transferred under a situation that it is difficult to appropriately transfer the article.

Also, with this configuration, when no transfer processing is performed after the travel of the travel unit is stopped as described above, it is possible to give a notification of an occurrence of an anomaly to the superordinate control unit that outputs an operation command for the article transport vehicle. Accordingly, even if the stop position indicator section is erroneously detected by the indicator detection unit, the superordinate control unit can appropriately control the subsequent state of the article transport vehicle.

Here, preferably, the superordinate control unit re-outputs, in response to the notification of an occurrence of an anomaly provided by the control unit, a travel command to the article transport vehicle including the control unit, the travel command instructing the article transport vehicle to travel to, as a destination, the stop site at which the stop position indicator related to the occurrence of an anomaly is disposed, and the control unit restarts the travel of the travel unit in response to the re-outputted travel command.

With this configuration, even if the travel of the travel unit is stopped in response to erroneous detection of the stop position indicator section by the indicator detection unit, it is possible to restart the travel of the travel unit so that the article transport vehicle is stopped at the stop position that corresponds to the transfer target location at which an article is to be transferred. Thus, if, for example, the erroneous detection of the stop position indicator section by the indicator detection unit accidentally occurs, it is possible for the article transport vehicle to transfer an article to or from a planned transfer target location.

As described above, preferably, the superordinate control unit does not re-output the travel command, and provides an anomaly warning with use of a display apparatus or a sound output apparatus in response to the notification of an occurrence of an anomaly regarding an identical stop position indicator being provided by an identical article transport vehicle a predetermined number of times or more.

If the notification of an occurrence of an anomaly regarding the same stop position indicator is repeatedly given from the same article transport vehicle, there is a likelihood that erroneous detection of the stop position indicator section by the indicator detection unit was not accidental occurrence, but the indicator detection unit or the stop position indicator has a problem. With this configuration, if the above-described notification of an occurrence of an anomaly is given a set number of times or more, anomaly warning using the display apparatus or anomaly warning using the sound output apparatus is executed, and thus in the situation in which the indicator detection unit or the stop position indicator may have a problem, it is possible to prompt an operator or the like to perform checking.

In the control system having the above-described configurations, preferably, in response to the notification of an occurrence of an anomaly provided by the control unit, the superordinate control unit stores, in a storage device, anomaly occurrence information including information related to at least one of the article transport vehicle including the control unit or the stop position indicator related to the occurrence of an anomaly.

With this configuration, by storing the anomaly occurrence information in the storage device, the history of anomaly occurrence can be registered, and thus when the indicator detection unit or the stop position indicator has a problem, it is possible to specify an article transport vehicle including a problematic indicator detection unit, or specify a problematic stop position indicator.

A control system for controlling an article transport vehicle configured to travel along a predetermined travel route and transport an article includes: a stop position indicator at a position corresponding to a stop site provided for the article transport vehicle on the travel route, wherein the article transport vehicle includes: a travel unit configured to travel along the travel route; a transfer unit configured to hold the article and transfer the article to and from a transfer target location at the stop site; an indicator detection unit configured to detect the stop position indicator; and a control unit configured to control the travel unit and the transfer unit, the stop position indicator includes: a stop position indicator section indicating a stop position for the article transport vehicle; and a stop notice indicator section arranged on an upstream side with respect to the stop position indicator section, the upstream side being a rearward side in a travel direction of the article transport vehicle traveling along the travel route, the stop notice indicator section has on the upstream side an end apart from the stop position indicator section to the upstream side by a predetermined notice distance, in response to (i) the indicator detection unit detecting the stop notice indicator section and (ii) the control unit then determining based on a result of the indicator detection unit detecting the stop position indicator section that the article transport vehicle has reached a position at which the stop position indicator section is disposed, the control unit performs a travel stop process for stopping travel of the travel unit, and performs, after the travel of the travel unit is stopped as a result of the travel stop process, a transfer process for causing the transfer unit to transfer the article, the article transport vehicle further includes a travel distance detection unit configured to detect a travel distance of the travel unit, and in response to (i) the travel distance from a position at which the indicator detection unit has detected the stop notice indicator section being not larger than a determination distance smaller than the notice distance and (ii) the indicator detection unit detecting the stop position indicator section, the control unit does not determine that the article transport vehicle has reached the position at which the stop position indicator section is disposed and continues travel of the travel unit, and in response to the travel distance from a position at which the indicator detection unit has detected the stop notice indicator section exceeding the determination distance, and the indicator detection unit then detecting the stop position indicator section, the control unit determines that the article transport vehicle has reached the position at which the stop position indicator section is disposed.

If the distance (hereinafter, referred to as "object distance") between a position at which the stop notice indicator section is detected by the indicator detection unit, and a position at which the stop position indicator section is detected by the indicator detection unit is apparently shorter than the notice distance, which is a distance between the end of the stop notice indicator section on the upstream side and the stop position indicator section, there is a high likelihood that the stop position indicator section has been erroneously detected by the indicator detection unit. With this configuration, if the stop notice indicator section is detected by the indicator detection unit, and then the stop position indicator section is detected by the indicator detection unit, it is possible to obtain the above-described object distance based on the travel distance of the travel unit from the position at which the stop notice indicator section is detected. Also, if the obtained object distance is shorter than the notice distance to such an extent that it is less than or equal to the determination distance, it is possible to determine that the stop position indicator section has been erroneously detected (in other words, it is possible to not determine that the article transport vehicle has reached the position at which the stop position indicator section is provided), and continue the travel of the travel unit without stopping the travel of the travel unit. Therefore, even if the stop position indicator section is erroneously detected by the indicator detection unit, it is possible to reduce a risk that an article is transferred under a situation that it is difficult to appropriately transfer the article.

In the control systems according to the above-described configurations, preferably, the control unit provides an anomaly warning with use of a display apparatus or a sound output apparatus in response to (i) the travel distance from a position at which the indicator detection unit has detected the stop notice indicator section being not larger than the determination distance and (ii) the indicator detection unit detecting the stop position indicator section a predetermined number of times or more.

If the stop position indicator section is repeatedly detected by the indicator detection unit while the travel distance from the position at which the stop notice indicator section has been detected by the indicator detection unit is less than or equal to the determination distance, there is a likelihood that erroneous detection of the stop position indicator section by the indicator detection unit was not accidental occurrence, but the indicator detection unit or the stop position indicator has a problem. With this configuration, if the stop position indicator section is detected by the indicator detection unit a set number of times or more while the travel distance from the position at which the stop notice indicator section has been detected by the indicator detection unit is less than or equal to the determination distance, anomaly warning using the display apparatus or anomaly warning using the sound output apparatus is executed, and thus in the situation in which the indicator detection unit or the stop position indicator may have a problem, it is possible to prompt an operator or the like to perform checking.

Also, preferably, the control system has a range in which the travel distance from a position at which the indicator detection unit has detected the stop notice indicator section is not larger than the determination distance which range is based on a range in which the transfer unit is unable to transfer the article to or from the transfer target location.

With this configuration, it is possible to set the determination distance as appropriate so as to reduce the risk that an article is transferred under a situation that it is difficult to appropriately transfer the article.

Also, preferably, the control unit performs the transfer process in response to the indicator detection unit detecting the stop position indicator section and continuing to detect the stop position indicator section for a predetermined period of time or longer.

Even when the stop position indicator section is detected by the indicator detection unit, there is a high likelihood that the detection of the stop position indicator section is erroneous if the stop position indicator section does not continue to be detected. With this configuration, if the stop position indicator section continues to be detected by the indicator detection unit, then the transfer processing can be executed, and thus it is possible to prevent an article from being transferred under a situation that appropriate transfer of the article is difficult.

It is sufficient that the control system according to the present disclosure can realize at least one of the above-described effects.

What is claimed is:

1. A control system for controlling an article transport vehicle configured to travel along a predetermined travel route and transport an article, the control system comprising:
   a stop position indicator at a position corresponding to a stop site provided for the article transport vehicle on the travel route; and
   a superordinate control unit communicably connected to the article transport vehicle and configured to output an operation command for the article transport vehicle;
   wherein the article transport vehicle comprises:
      a travel unit configured to travel along the travel route;
      a transfer unit configured to hold the article and transfer the article to and from a transfer target location at the stop site;
      an indicator detection unit configured to detect the stop position indicator; and
      a control unit configured to control the travel unit and the transfer unit,
   wherein the stop position indicator comprises:
      a stop position indicator section indicating a stop position for the article transport vehicle; and
      a stop notice indicator section on an upstream side of the stop position indicator section, the upstream side is a rearward side in a travel direction of the article transport vehicle traveling along the travel route,
   wherein:
   the stop notice indicator section has on the upstream side an end apart from the stop position indicator section to the upstream side by a predetermined notice distance,
   in response to the indicator detection unit detecting the stop notice indicator section and then detecting the stop position indicator section, the control unit performs a travel stop process for stopping travel of the travel unit, and performs, after the travel of the travel unit is stopped as a result of the travel stop process, a transfer process for causing the transfer unit to transfer the article,
   the article transport vehicle further comprises a travel distance detection unit configured to detect a travel distance of the travel unit, and
   the control unit performs, instead of the transfer process, an anomaly notification process for providing a notification of an occurrence of an anomaly to the superordinate control unit, after the travel of the travel unit is stopped by the travel stop process, in response to: (i) determining that the travel distance, from a position at which the indicator detection unit has detected the stop notice indicator section, is smaller than a determination distance smaller than the notice distance, and (ii) the indicator detection unit detecting the stop position indicator section.

2. The control system according to claim 1,
   wherein the superordinate control unit re-outputs, in response to the notification of an occurrence of an anomaly provided by the control unit, a travel command to the article transport vehicle including the control unit, the travel command instructing the article transport vehicle to travel to, as a destination, the stop site at which the stop position indicator related to the occurrence of an anomaly is disposed, and wherein the control unit restarts the travel of the travel unit in response to the re-outputted travel command.

3. The control system according to claim 2, wherein the superordinate control unit does not re-output the travel command, and provides an anomaly warning with use of a display apparatus or a sound output apparatus in response to the notification of an occurrence of an anomaly regarding an identical stop position indicator provided by an identical article transport vehicle a predetermined number of times or more.

4. The control system according to claim 1, wherein in response to the notification of an occurrence of an anomaly provided by the control unit, the superordinate control unit stores, in a storage device, anomaly occurrence information including information related to at least one of the article transport vehicle including the control unit or the stop position indicator related to the occurrence of an anomaly.

5. The control system according to claim 1, wherein the control unit provides an anomaly warning with use of a display apparatus or a sound output apparatus in response to: (i) the travel distance, from a position at which the indicator detection unit has detected the stop notice indicator section, being smaller than the determination distance, and (ii) the indicator detection unit detecting the stop position indicator section a predetermined number of times or more.

6. The control system according to claim 1, wherein the control system has a range in which the travel distance from a position at which the indicator detection unit has detected the stop notice indicator section is not larger than the determination distance which range is based on a range in which the transfer unit is unable to transfer the article to or from the transfer target location.

7. The control system according to claim 1, wherein the control unit performs the transfer process in response to the indicator detection unit detecting the stop position indicator section and continuing to detect the stop position indicator section for a predetermined period of time or longer.

8. A control system for controlling an article transport vehicle configured to travel along a predetermined travel route and transport an article, the control system comprising:

a stop position indicator at a position corresponding to a stop site provided for the article transport vehicle on the travel route, wherein the article transport vehicle comprises:

a travel unit configured to travel along the travel route;

a transfer unit configured to hold the article and transfer the article to and from a transfer target location at the stop site;

an indicator detection unit configured to detect the stop position indicator; and a control unit configured to control the travel unit and the transfer unit, the stop position indicator comprises:

a stop position indicator section indicating a stop position for the article transport vehicle; and a stop notice indicator section arranged on an upstream side with respect to the stop position indicator section, the upstream side is a rearward side in a travel direction of the article transport vehicle traveling along the travel route, wherein:

the stop notice indicator section has on the upstream side an end apart from the stop position indicator section to the upstream side by a predetermined notice distance, in response to (i) the indicator detection unit detecting the stop notice indicator section and (ii) the control unit then determining based on a result of the indicator detection unit detecting the stop position indicator section that the article transport vehicle has reached a position at which the stop position indicator section is disposed, the control unit performs a travel stop process for stopping travel of the travel unit, and performs, after the travel of the travel unit is stopped as a result of the travel stop process, a transfer process for causing the transfer unit to transfer the article, the article transport vehicle further comprises a travel distance detection unit configured to detect a travel distance of the travel unit, and in response to: (i) the travel distance, from a position at which the indicator detection unit has detected the stop notice indicator section, being smaller than a determination distance smaller than the notice distance, and (ii) the indicator detection unit detecting the stop position indicator section, the control unit does not determine that the article transport vehicle has reached the position at which the stop position indicator section is disposed and continues travel of the travel unit, and in response to the travel distance from a position at which the indicator detection unit has detected the stop notice indicator section exceeding the determination distance, and the indicator detection unit then detecting the stop position indicator section, the control unit determines that the article transport vehicle has reached the position at which the stop position indicator section is disposed.

9. The control system according to claim 8, wherein the control unit provides an anomaly warning with use of a display apparatus or a sound output apparatus in response to: (i) the travel distance, from a position at which the indicator detection unit has detected the stop notice indicator section, being smaller than the determination distance, and (ii) the indicator detection unit detecting the stop position indicator section a predetermined number of times or more.

10. The control system according to claim 8, wherein the control system has a range in which the travel distance from a position at which the indicator detection unit has detected the stop notice indicator section is not larger than the determination distance which range is based on a range in which the transfer unit is unable to transfer the article to or from the transfer target location.

11. The control system according to claim 8, wherein the control unit performs the transfer process in response to the indicator detection unit detecting the stop position indicator section and continuing to detect the stop position indicator section for a predetermined period of time or longer.

* * * * *